United States Patent
Liou et al.

(10) Patent No.: US 9,356,108 B2
(45) Date of Patent: May 31, 2016

(54) DUMMY STRUCTURE FOR MULTIPLE GATE DIELECTRIC INTERFACE AND METHODS

(71) Applicant: Taiwan Semiconductor Manufacturing Company, Ltd., Hsin-Chu (TW)

(72) Inventors: Huei-Ru Liou, Luzhu Township (TW); Chien-Chih Chou, New Taipei (TW); Kong-Beng Thei, Hsin-Chu Country (TW); Gwo-Yuh Shiau, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/448,523

(22) Filed: Jul. 31, 2014

(65) Prior Publication Data

US 2014/0342541 A1   Nov. 20, 2014

Related U.S. Application Data

(62) Division of application No. 13/416,093, filed on Mar. 9, 2012, now Pat. No. 8,847,319.

(51) Int. Cl.
*H01L 29/423*   (2006.01)
*H01L 29/51*   (2006.01)
*H01L 21/8238*   (2006.01)

(52) U.S. Cl.
CPC .... *H01L 29/42364* (2013.01); *H01L 21/82385* (2013.01); *H01L 21/823857* (2013.01); *H01L 29/51* (2013.01); *H01L 21/823814* (2013.01)

(58) Field of Classification Search
CPC .............. H01L 29/42364; H01L 29/51; H01L 21/823857
See application file for complete search history.

(56) References Cited

U.S. PATENT DOCUMENTS

| | | | |
|---|---|---|---|
| 5,291,439 A | 3/1994 | Kauffmann et al. |
| 5,293,331 A | 3/1994 | Hart et al. |
| 5,404,037 A | 4/1995 | Manley |
| 5,514,607 A | 5/1996 | Taneda |
| 5,731,237 A | 3/1998 | Sato |
| 5,904,525 A | 5/1999 | Hshieh et al. |
| 6,084,271 A | 7/2000 | Yu et al. |

(Continued)

FOREIGN PATENT DOCUMENTS

| | | |
|---|---|---|
| CN | 1518089 | 8/2004 |
| KR | 100350055 | 8/2002 |

(Continued)

OTHER PUBLICATIONS

Korean Office Action and English Translation, Patent Application No. 10-2012-0068510, Jan. 13, 2014, 8 pages.

*Primary Examiner* — Amar Movva
(74) *Attorney, Agent, or Firm* — Slater Matsil, LLP

(57) ABSTRACT

Dummy structures between a high voltage (HV) region and a low voltage (LV) region of a substrate are disclosed, along with methods of forming the dummy structures. An embodiment is a structure comprising a HV gate dielectric over a HV region of a substrate, a LV gate dielectric over a LV region of the substrate, and a dummy structure over a top surface of the HV gate dielectric. A thickness of the LV gate dielectric is less than a thickness of the HV gate dielectric. The dummy structure is on a sidewall of the HV gate dielectric.

18 Claims, 6 Drawing Sheets

(56) References Cited

U.S. PATENT DOCUMENTS

| | | |
|---|---|---|
| 6,121,086 A | 9/2000 | Kuroda et al. |
| 6,194,702 B1 | 2/2001 | Hook et al. |
| 6,242,298 B1 | 6/2001 | Kawakubo |
| 6,246,094 B1 | 6/2001 | Wong et al. |
| 6,380,019 B1 | 4/2002 | Yu et al. |
| 6,444,554 B1 | 9/2002 | Adachi et al. |
| 6,461,906 B1 * | 10/2002 | Lung ............... H01L 21/823412 257/E21.444 |
| 6,531,366 B1 | 3/2003 | Kouznetsov |
| 6,642,105 B2 | 11/2003 | Kim et al. |
| 6,653,682 B1 | 11/2003 | Houdt et al. |
| 6,806,530 B2 | 10/2004 | Kim |
| 6,884,682 B2 | 4/2005 | Lee |
| 7,038,268 B2 | 5/2006 | Kinoshita et al. |
| 7,557,004 B2 | 7/2009 | Ogawa et al. |
| 7,816,726 B2 | 10/2010 | He et al. |
| 7,939,893 B2 | 5/2011 | Ema et al. |
| 8,102,007 B1 | 1/2012 | Hyde et al. |
| 8,350,253 B1 * | 1/2013 | Zhu ................ H01L 21/823807 257/19 |
| 8,368,161 B2 | 2/2013 | Koga et al. |
| 2002/0119615 A1 | 8/2002 | Kim |
| 2004/0145020 A1 | 7/2004 | Kang et al. |
| 2004/0262683 A1 | 12/2004 | Bohr et al. |
| 2005/0104118 A1 | 5/2005 | Diorio et al. |
| 2010/0025761 A1 | 2/2010 | Voldman |

FOREIGN PATENT DOCUMENTS

| | | |
|---|---|---|
| KR | 100396956 | 11/2003 |
| KR | 20040065971 | 7/2004 |
| KR | 100741238 | 7/2007 |
| TW | 460953 | 10/2001 |

* cited by examiner

US 9,356,108 B2

DUMMY STRUCTURE FOR MULTIPLE GATE DIELECTRIC INTERFACE AND METHODS

This application is a divisional of U.S. patent application Ser. No. 13/416,093, filed on Mar. 9, 2012, entitled "Dummy Structure for Multiple Gate Dielectric Interface and Methods," which application is hereby incorporated herein by reference in its entirety.

BACKGROUND

Size reduction of complementary metal-oxide-semiconductor (CMOS) devices, such as transistors, has enabled the continued improvement in speed, performance, density, and cost per unit function of integrated circuits over the past few decades. As sizes are reduced, there has been a trend to integrate more functions on a single chip, some of which require higher voltage levels.

In these situations, it is common for a single die to include transistors having different gate structures. For example, low-voltage devices are typically formed using a relatively thin gate oxide layer, while high-voltage devices are typically formed using a relatively thick gate oxide layer. These structures may have an edge where the thicker oxide layer terminates.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
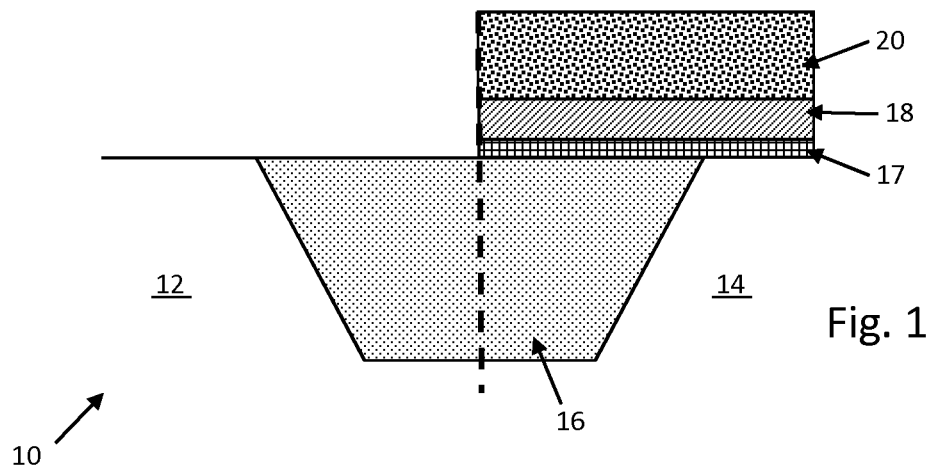
FIGS. 1 through 8 are a method to form a dummy structure between a high voltage (HV) region and a low voltage (LV) region in a substrate according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a context, namely applications where a dielectric for a high voltage (HV) device and/or for a low voltage (LV) device meets a boundary between a HV region and a LV region. Specific examples are illustrated with respect to a lateral double-diffused transistor and a double-diffused-drain transistor each in conjunction with a LV transistor. Other embodiments may also be applied, however, to other combinations of a HV device and a LV device. HV devices generally have operating voltages that are greater than LV devices, for example, HV devices can have operating voltages greater than 8 volts, while LV devices can have operating voltages less than 2 volts. Operating voltages can be varied for different applications.

It should be noted that, although methods disclosed herein are described in a particular order, method embodiments may include steps performed in any logical order. Additionally, like reference characters in the figures refer to like components.

FIGS. 1 through 8 illustrate a method to form a dummy structure between a HV region 12 and a LV region 14 in a substrate 10. FIG. 1 illustrates an intermediate structure after depositing and patterning a pad oxide layer 17 and a sacrificial nitride layer 18 over a substrate 10. The substrate 10 comprises a HV region 12, a LV region 14, and an isolation region 16, such as a shallow trench isolation (STI). The substrate 10 can be a semiconductor substrate, such as a bulk silicon substrate, a semiconductor on insulator (SOI), or the like. Further, the HV region 12 and the LV region 14 can be in an epitaxial growth layer of the substrate 10. Additionally, the substrate 10 can be doped with various wells, such as according to appropriate HV and LV applications. The HV region 12 and the LV region 14 are demarcated in this example by the dashed line.

The pad oxide layer 17 is deposited over the substrate 10 using, for example, a chemical vapor deposition (CVD), furnace deposition, the like, or a combination thereof. In the illustrated embodiment, the pad oxide layer 17 is silicon oxide, and in other embodiments, the layer can be silicon nitride, silicon oxynitride, the like, or a combination thereof. The sacrificial nitride layer 18 is deposited over the pad oxide layer 17 using, for example, CVD or the like. In the illustrated embodiment, the sacrificial nitride layer 18 is silicon nitride, and in other embodiments, the layer can be silicon oxynitride, polysilicon, the like, or a combination thereof. A photoresist 20 is deposited over the sacrificial nitride layer 18 using, for example, a spin on deposition. The photoresist 20 is exposed and developed such that the photoresist 20 remains over the pad oxide layer 17 and the sacrificial nitride layer 18 over the LV region 14 of the substrate 10. Portions of the pad oxide layer 17 and the sacrificial nitride layer 18 over the HV region 12 are then removed using, for example, an appropriate etch process. The photoresist 20 is then removed using, for example, an acceptable ashing process. The remaining pad oxide layer 17 and the sacrificial nitride layer 18 over the LV region 14 of the substrate 10 can function as protection layers and/or mask layers during subsequent process steps.

Figure 2:
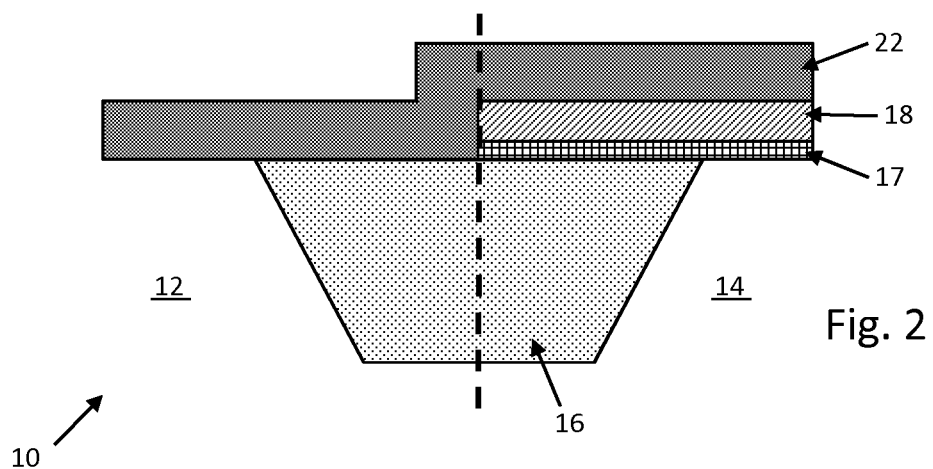

FIG. 2 illustrates an intermediate structure after deposition of a HV gate dielectric layer 22 over the substrate 10. The HV gate dielectric layer 22 is conformally deposited over the substrate 10 and the sacrificial nitride layer 18 using, for example, CVD, a furnace deposition, in situ steam generated (ISSG) formation, the like, or a combination thereof. In the illustrated embodiment, the HV gate dielectric layer 22 is an oxide, such as silicon oxide, silicon nitride, composite oxide/nitride/oxide, the like, or a combination thereof. Other acceptable materials can be used for the HV gate dielectric layer 22. The thickness of the HV gate dielectric layer 22 is, for example, between approximately 250 Å and approximately 4,000 Å.

Figure 3:
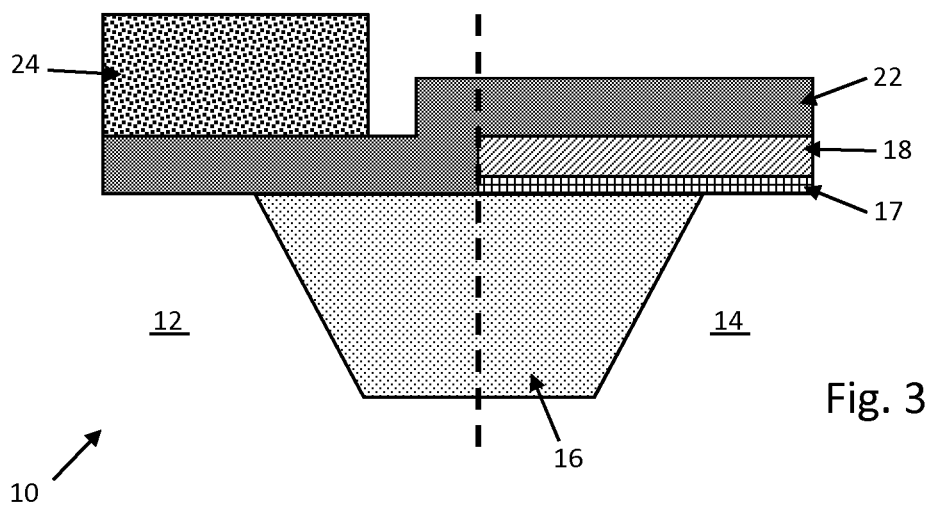

In FIG. 3, a photoresist 24 is deposited over the HV gate dielectric layer 22 using, for example, a spin on deposition. The photoresist 24 is exposed and developed such that the photoresist 24 remains over the HV gate dielectric layer 22 over the HV region 12 of the substrate 10. The patterned photoresist 24 laterally extends over a portion of the isolation region 16 and not fully to the step in the HV gate dielectric 22 formed by the conformal deposition near lateral sidewalls of the pad oxide layer 17 and the sacrificial nitride layer 18. The HV gate dielectric 22 over the LV region 14 and over a portion of the isolation region 16 is exposed by the photoresist 24.

Figure 4:
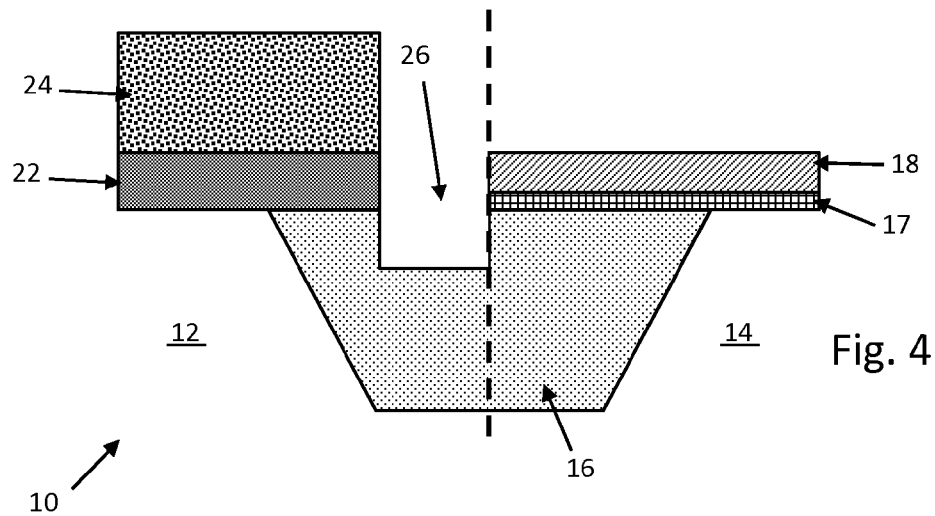

In FIG. 4, the exposed HV gate dielectric 22 is removed using an acceptable etching process, such as an isotropic etch. The sacrificial nitride layer 18 and the pad oxide layer 17 remain as a mask and/or protection layer over the substrate 10 during the etching. A recess 26 can be formed in the isolation region 16 during the etch. The recess 26 can be formed laterally between a sidewall of the photoresist 24 and sidewalls of the pad oxide layer 17 and the sacrificial nitride layer 18. The photoresist 24 is then removed using, for example, an acceptable ashing process.

Figure 5:
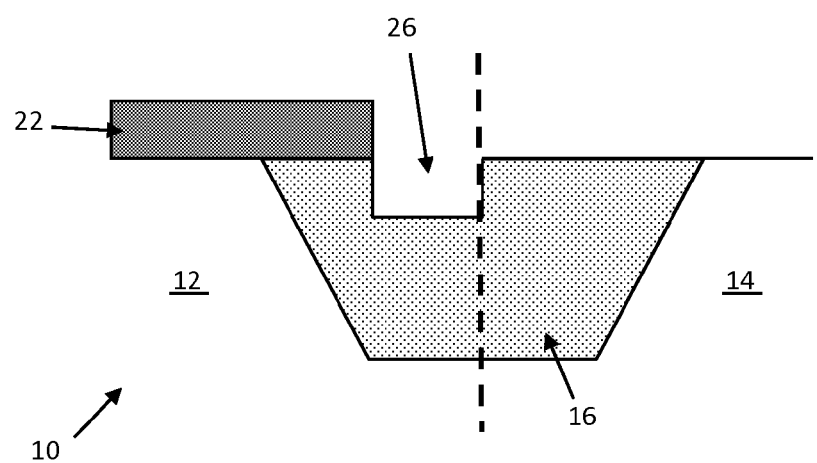

FIG. 5 illustrates the substrate 10 with the sacrificial nitride layer 18 and pad oxide layer 17 removed. The sacrificial nitride layer 18 and pad oxide layer 17 can be removed using, for example, appropriate etching processes selective to each layer. At this point, doped wells can be formed in the LV region 14 by, for example, ion implantation of appropriate dopants.

Figure 6:
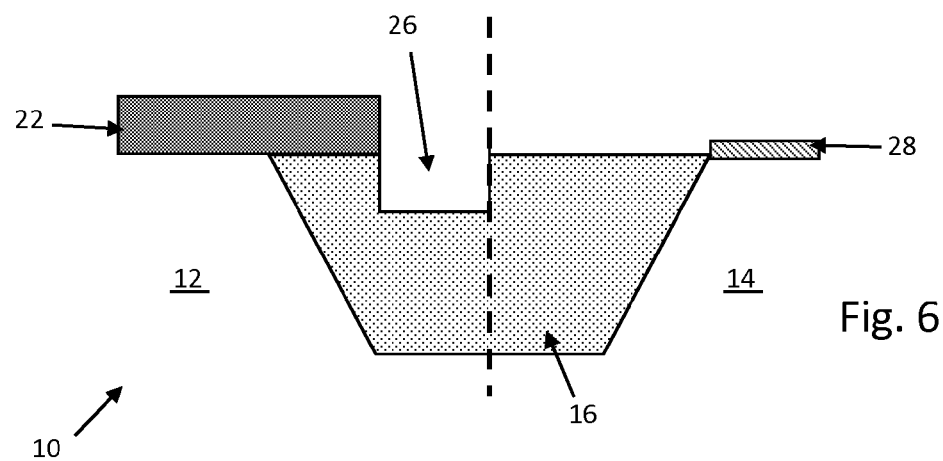

FIG. 6 depicts a LV gate dielectric 28 formed over the substrate 10. The LV gate dielectric 28 is formed using, for example, thermal oxidation. As shown in FIG. 6, the LV gate dielectric 28 is formed over the LV region 14 of the substrate 10. In this embodiment, the LV gate dielectric 28 comprises an oxide, such as silicon oxide. In other embodiments, the LV gate dielectric 28 can comprise hafnium oxide, tantalum oxide, aluminum oxide, the like, or a combination thereof. The LV gate dielectric 28 has a thickness, for example, between approximately 15 Å and approximately 150 Å. The LV gate dielectric 28 generally has a thickness less than the thickness of the HV gate dielectric 22.

Figure 7:
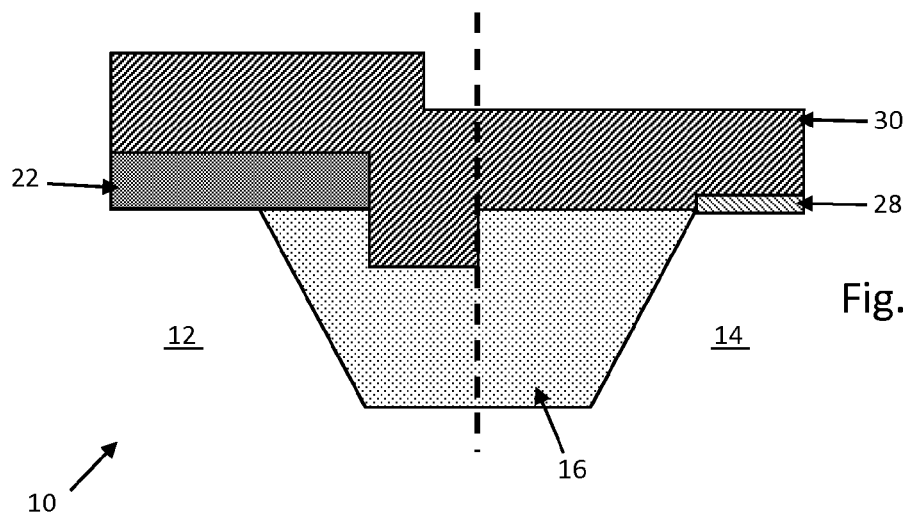

In FIG. 7, a gate electrode layer 30 is conformally deposited over the HV gate dielectric 22 and the LV gate dielectric 28, and in the recess 26. In this embodiment, the gate electrode layer 30 comprises polysilicon or the like deposited using, for example, CVD, a furnace deposition, the like or a combination thereof. The gate electrode layer 30 can subsequently be used to form gate electrodes for devices in the HV region 12 and devices in the LV region 14.

Figure 8:
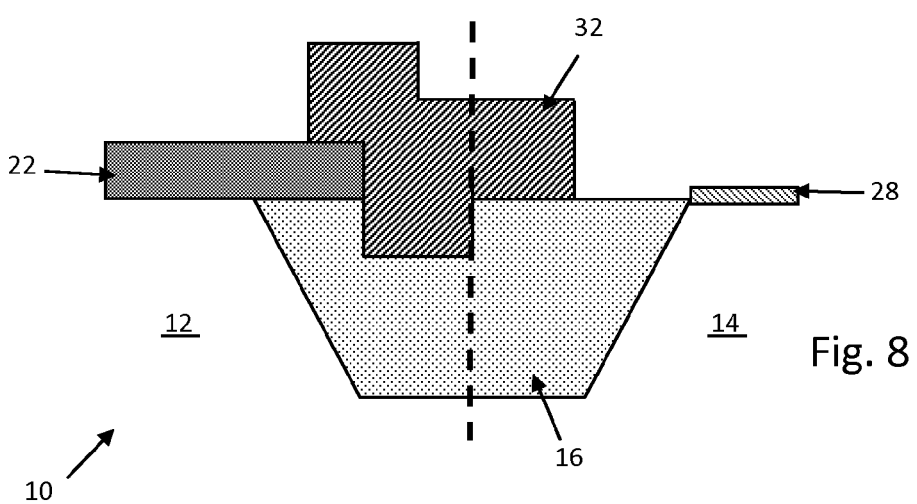

In FIG. 8, the gate electrode layer 30 is patterned to form a dummy structure 32 at a boundary between the HV region 12 and the LV region 14. A photoresist can be deposited over the gate electrode layer 30 and patterned such that photoresist remains over the portion of the gate electrode layer 30 that will become the dummy structure 32. An etch can then remove portions of the gate electrode layer 30 that are exposed, leaving the dummy structure 32. Gate electrodes for devices in the HV region 12 and the LV region 14 can also be formed during these steps.

The structure in FIG. 8, according to this embodiment, comprises a polysilicon dummy structure 32 at a boundary between the HV region 12 and the LV region 14 of the substrate 10 and at the isolation region 16 in the substrate 10. The dummy structure 32 is over a portion of a top surface of the HV gate dielectric 22 and over the isolation region 16. The dummy structure 32 is on a sidewall of the HV gate dielectric 22 over the isolation region 16. Additionally, the dummy structure 32 is in the recess 26 in the isolation region 16, which has a sidewall that is laterally co-extensive with the sidewall of the HV gate dielectric 22. Other devices are also formed on and/or in the HV region 12 and the LV region 14.

It should be noted that other components and features can be included in the structure of FIG. 8. For example, a dielectric layer can be conformally deposited and subsequently etched to form spacers along sidewalls of the dummy structure 32. A metal can then be deposited and annealed to form silicide on the dummy structure 32. Then, an etch stop layer can be conformally deposited over the substrate 10. Additional dielectric layers and metallization patterns can then be deposited and formed thereover.

Figure 9:
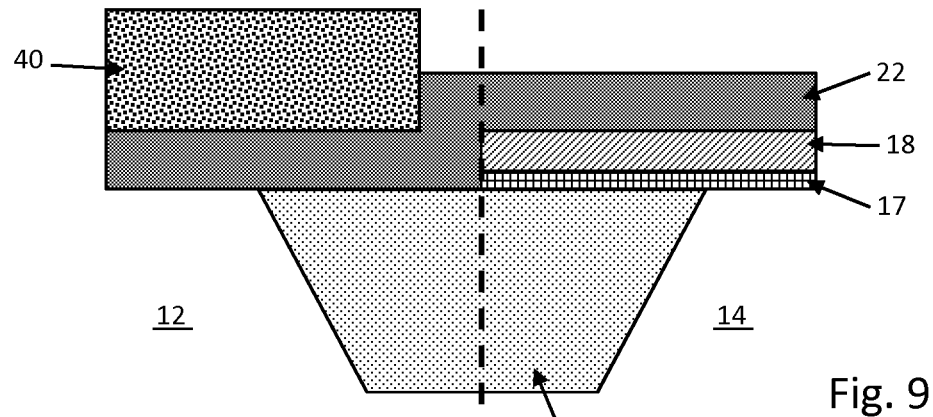
FIGS. 9 through 14 are another method to form a dummy structure between a HV region and a LV region in a substrate according to an embodiment.

FIGS. 9 through 14 illustrate another method to form a dummy structure between a HV region 12 and a LV region 14 in a substrate 10. The method begins as described with respect to FIGS. 1 and 2. In FIG. 9, a photoresist 40 is deposited over the HV gate dielectric layer 22 using, for example, a spin on deposition. The photoresist 40 is exposed and developed such that the photoresist 40 remains over the HV gate dielectric layer 22 over the HV region 12 of the substrate 10. The patterned photoresist 24 laterally extends over a portion of the isolation region 16 and fully to the step in the HV gate dielectric 22 formed by the conformal deposition near lateral sidewalls of the pad oxide layer 17 and the sacrificial nitride layer 18. The HV gate dielectric 22 over the LV region 14 and over a portion of the isolation region 16 is exposed by the photoresist 40.

Figure 10:
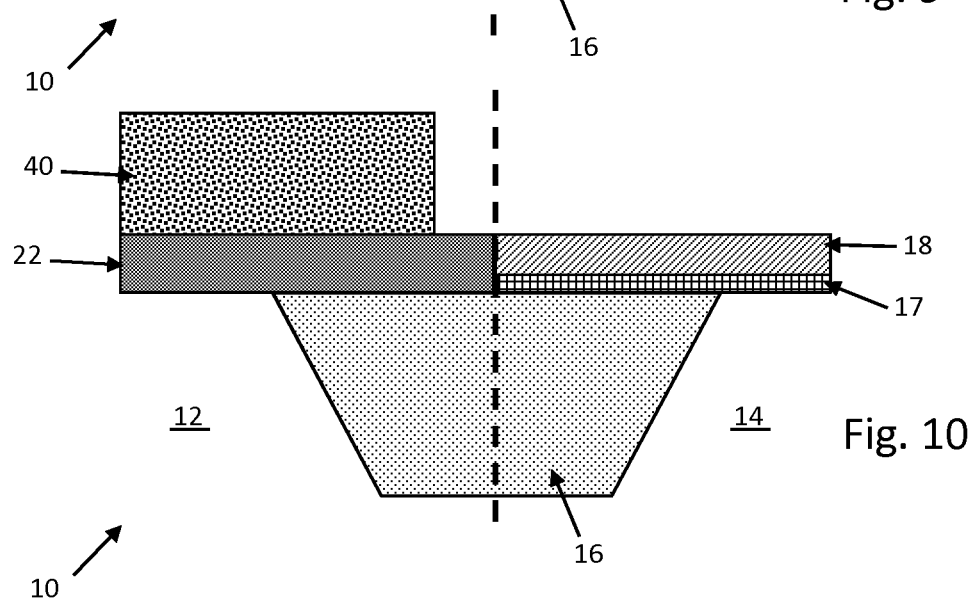

In FIG. 10, the exposed HV gate dielectric 22 is removed using an acceptable etching process. The sacrificial nitride layer 18 and the pad oxide layer 17 remain as a mask and/or protection layer over the substrate 10 during the etching. The remaining HV gate dielectric 22 can have a substantially planar top surface and can extend laterally to interface with the pad oxide layer 17 and the sacrificial nitride layer 18. The photoresist 40 is then removed using, for example, an acceptable ashing process.

Figure 11:
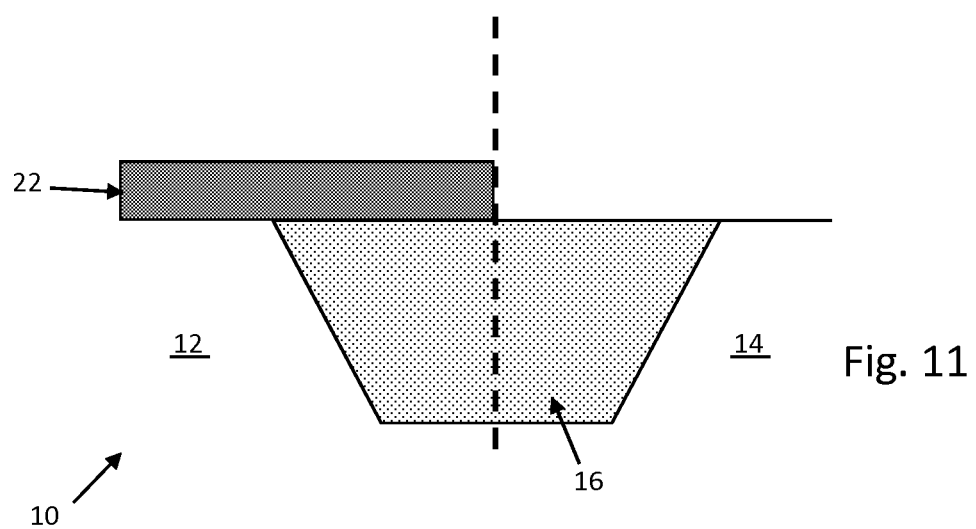

FIG. 11 illustrates the substrate 10 with the sacrificial nitride layer 18 and pad oxide layer 17 removed. The sacrificial nitride layer 18 and pad oxide layer 17 can be removed using, for example, appropriate etching processes selective to each layer. At this point, doped wells can be formed in the LV region 14 by, for example, ion implantation of appropriate dopants.

Figure 12:
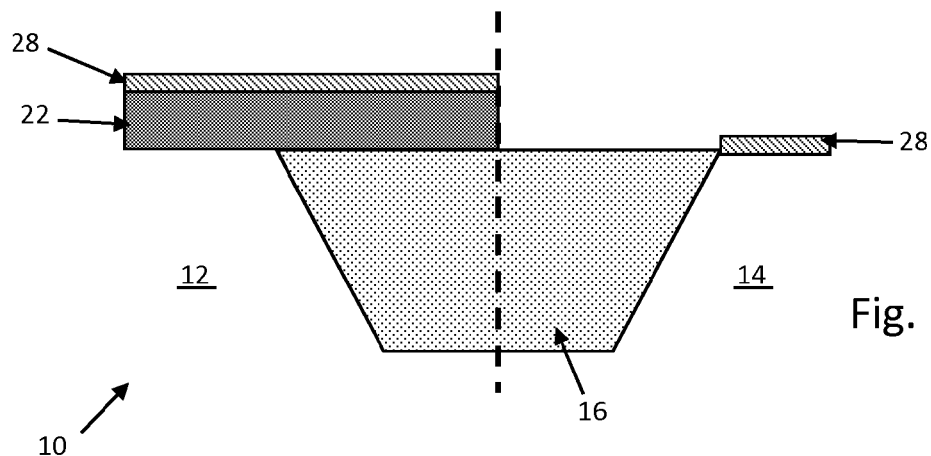

FIG. 12 depicts a LV gate dielectric 28 formed over the substrate 10. The LV gate dielectric 28 is formed using, for example, thermal oxidation. As shown in FIG. 12, the LV gate dielectric 28 is formed over the LV region 14 of the substrate 10. In this embodiment, the LV gate dielectric 28 comprises an oxide, such as silicon oxide. In other embodiments, the LV gate dielectric 28 can comprise hafnium oxide, tantalum oxide, aluminum oxide, the like, or a combination thereof. The LV gate dielectric 28 has a thickness, for example, between approximately 15 Å and approximately 150 Å. The LV gate dielectric 28 generally has a thickness less than the thickness of the HV gate dielectric 22.

Figure 13:
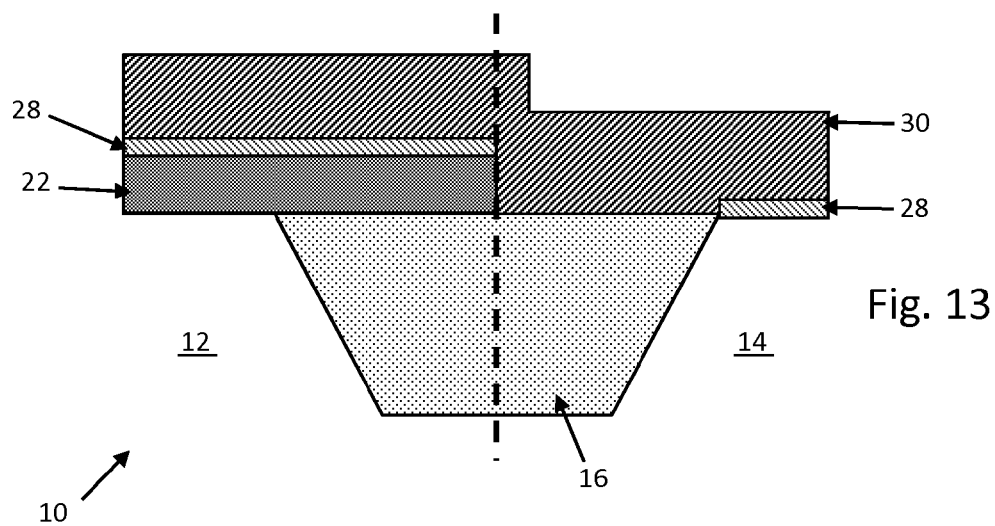

In FIG. 13, a gate electrode layer 30 is conformally deposited over the HV gate dielectric 22 and the LV gate dielectric 28. In this embodiment, the gate electrode layer 30 comprises polysilicon or the like deposited using, for example, CVD or the like. The gate electrode layer 30 can subsequently be used to form gate electrodes for devices in the HV region 12 and devices in the LV region 14.

Figure 14:
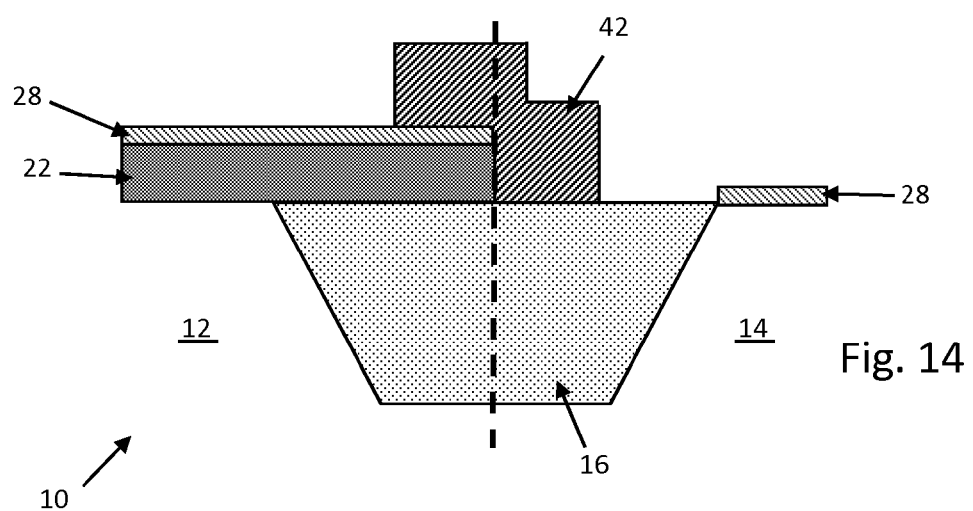

In FIG. 14, the gate electrode layer 30 is patterned to form a dummy structure 42 at a boundary between the HV region 12 and the LV region 14. A photoresist can be deposited over the gate electrode layer 30 and patterned such that photoresist remains over the portion of the gate electrode layer 30 that will become the dummy structure 42. An etch can then remove portions of the gate electrode layer 30 that are exposed, leaving the dummy structure 42. Gate electrodes for devices in the HV region 12 and the LV region 14 can also be formed during these steps.

The structure in FIG. 14, according to this embodiment, comprises a polysilicon dummy structure 42 at a boundary between the HV region 12 and the LV region 14 of the substrate 10 and at the isolation region 16 in the substrate 10. The dummy structure 42 is over a portion of a top surface of the HV gate dielectric 22 and over the isolation region 16. The dummy structure 32 is on sidewalls of the HV gate dielectric 22. Other devices are also formed on and/or in the HV region 12 and the LV region 14.

It should be noted that other components and features can be included in the structure of FIG. 14. For example, a dielectric layer can be conformally deposited and subsequently etched to form spacers along sidewalls of the dummy structure 42. A metal can then be deposited and annealed to form silicide on the dummy structure 42. Then, an etch stop layer can be conformally deposited over the substrate 10. Additional dielectric layers and metallization patterns can then be deposited and formed thereover.

Figure 15:
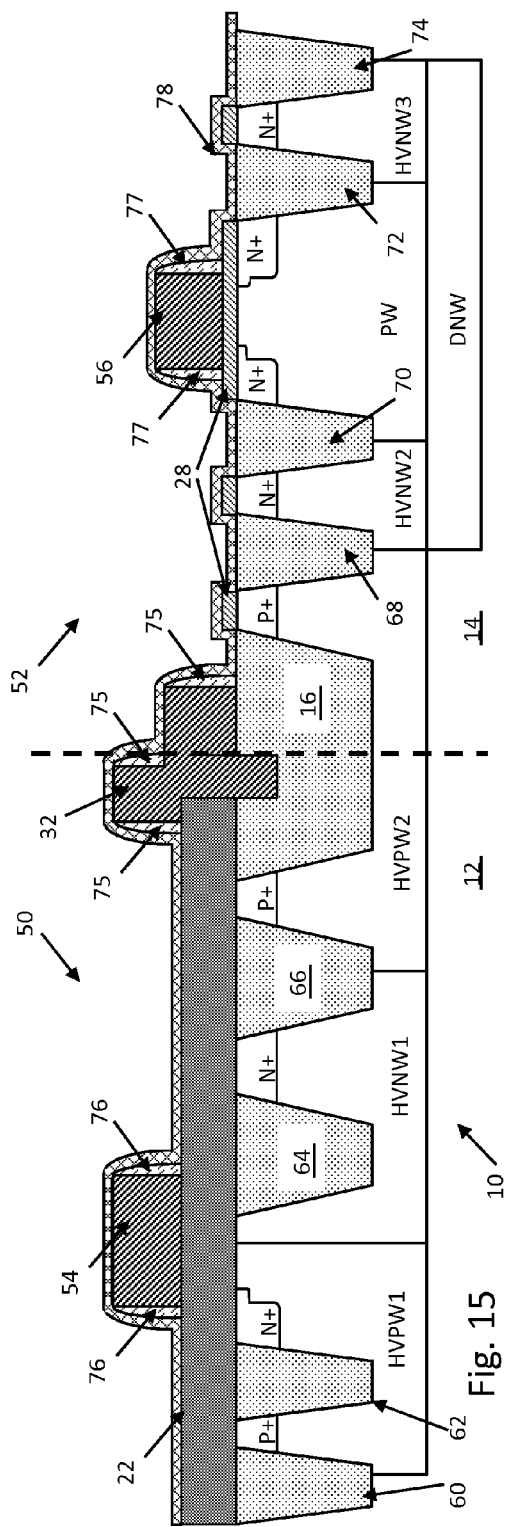
FIG. 15 is a structure comprising a HV lateral double-diffused transistor in and/or on a HV region of a substrate and a LV planar transistor in and/or on a LV region of the substrate according to an embodiment.

FIG. 15 illustrates a structure comprising a HV lateral double-diffused transistor 50 (e.g., commonly referred to as an LDMOS) in and/or on the HV region 12 of the substrate 10 and a LV planar transistor 52 in and/or on the LV region 14 of the substrate 10. In embodiments, components described as formed in the substrate 10 can be formed in an epitaxial layer over a substrate, in a bulk substrate, or the like.

In the HV region 12 of the substrate 10 are a first HV p-type well HVPW1, a second HV p-type well HVPW2, and a first HV n-type well HVNW1 disposed between the first well HVPW1 and the second well HVPW2. (As used hereinafter, different wells may be referenced only as a well and its reference character. The dopant type and HV indication can be inferred from the reference character.) In other embodiments, one HVPW surrounds the first well HVNW1. The second well HVPW2 is at the boundary between the HV region 12 and the LV region 14 and has the isolation region 16 formed therein.

Isolation region 60 is formed at an interface in the substrate 10 between the first well HVPW1 and an exterior well or component. Isolation region 62 is formed in the first well HVPW1, and a heavily doped p-type well P+ is formed in the first well HVPW1 between and adjacent the isolation regions 60 and 62. A heavily doped n-type well N+ with a lower doped extension region is formed in the first well HVPW1 adjacent the isolation region 62 opposite the well P+. An isolation region 64 is formed in the first well HVNW1, and an isolation region 66 is formed at an interface in the substrate 10 between the first well HVNW1 and the second well HVPW2. A heavily doped n-type well N+ is formed in the first well HVNW1 between and adjacent the isolation regions 64 and 66. A heavily doped p-type well P+ is formed in the second well HVPW2 between and adjacent isolation regions 66 and 16.

The HV gate dielectric 22 is over the HV region 12 of the substrate 10. A gate electrode 54 is formed over the HV gate dielectric 22 and extends laterally from over the extension region of the heavily doped n-type well N+ over the interface between the first well HVPW1 and the first well HVNW1 to over a portion of the isolation region 64.

In the LV region 14 of the substrate 10 are the second well HVPW2, a second well HVNW2 adjoining the second well HVPW2, a third well HVNW3, and a p-type well PW disposed between the second well HVNW2 and the third well HVNW3. In other embodiments, one HVNW surrounds the p-type well PW. The second well HVNW2, the p-type well PW, and the third well HVNW3 are over a deep n-type well DNW in the substrate 10.

An isolation region 68 is formed at an interface in the substrate 10 between the second well HVPW2 and the second well HVNW2. A heavily doped p-type well P+ is formed in the second well HVPW2 between and adjacent isolation regions 68 and 16. An isolation region 70 is formed at an interface in the substrate 10 between the second well HVNW2 and the p-type well PW. A heavily doped n-type well N+ is formed in the second well HVNW2 between and adjacent isolation regions 68 and 70. A heavily doped n-type well N+ with an extension region is formed in the p-type well PW adjacent isolation region 70 opposite the heavily doped n-type well N+ in the second well HVNW2. Isolation region 74 is formed at an interface in the substrate 10 between the third well HVNW3 and an exterior well or component. Isolation region 72 is formed at an interface in the substrate 10 between the p-type well PW and the third well HVNW3. A heavily doped n-type well N+ is formed in the third well HVNW3 between and adjacent the isolation regions 72 and 74. A heavily doped n-type well N+ with an extension region is formed in the p-type well PW adjacent isolation region 72 opposite the heavily doped n-type well N+ in the third well HVNW3.

The LV gate dielectric 28 is over the LV region 14 of the substrate 10, such as over the heavily doped n-type wells N+, the heavily doped p-type well P+, and the p-type well PV. A gate electrode 56 is formed over the LV gate dielectric 28 and extends laterally between the extension regions of the heavily doped n-type wells N+ in the p-type well PW.

The dummy structure 32, as discussed with respect to FIG. 8, is over the HV gate dielectric 22 and is in the recess in the isolation region 16 at the boundary between the HV region 12 and the LV region 14. Gate electrodes 54 and 56 in the HV region 12 and the LV region 14, respectively, can be formed in the same process steps as the dummy structure 32, as previously noted.

Spacers 75 are on sidewalls of the dummy structure 32. Spacers 76 are on sidewalls of the gate electrode 54, and spacers 77 are on sidewalls of gate electrode 56. A contact etch stop layer 78 extends over the HV gate dielectric 22, the LV gate dielectric 28, the dummy structure 32, the gate electrodes 54 and 56, and the spacers 75, 76, and 77. Example materials for the spacers 75, 76, and 77 and the contact etch stop layer 78 include silicon oxide, silicon nitride, the like, or a combination thereof. A person having ordinary skill in the art will readily appreciate other acceptable materials for these components and processes to form them.

Figure 16:
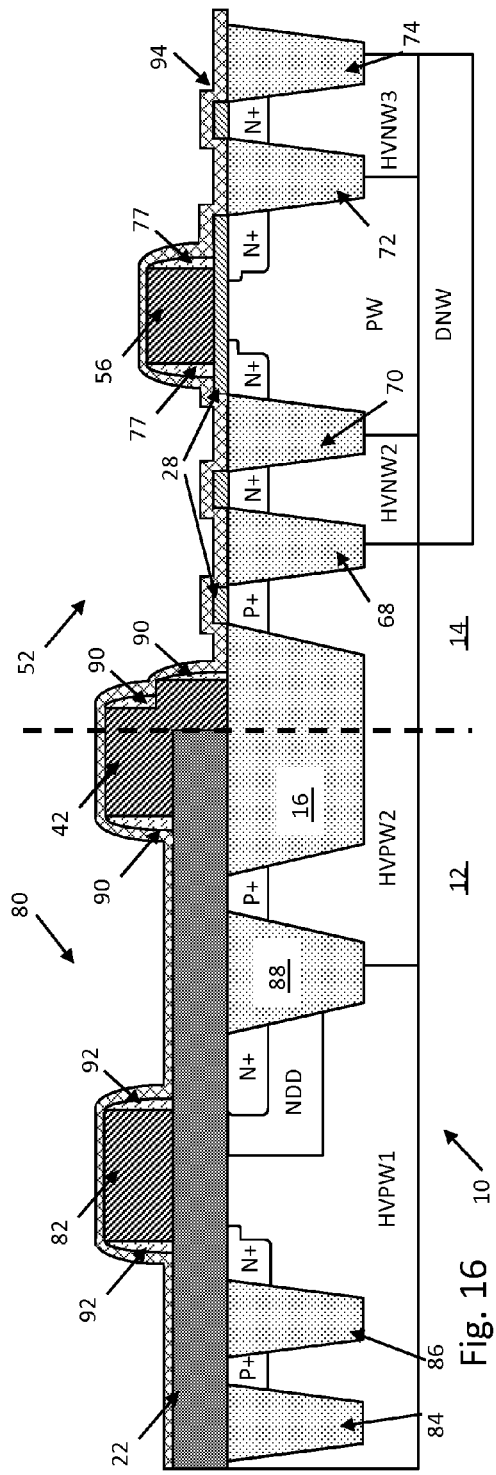
FIG. 16 is a structure comprising a HV double-diffused-drain transistor in and/or on a HV region of a substrate and a LV planar transistor in and/or on a LV region of the substrate according to an embodiment.

FIG. 16 illustrates a structure comprising a HV double-diffused-drain transistor 80 (e.g., commonly referred to as a DDDMOS) in and/or on the HV region 12 of the substrate 10 and the LV planar transistor 52 in and/or on the LV region 14 of the substrate 10. In embodiments, components described as formed in the substrate 10 can be formed in an epitaxial layer over a substrate, in a bulk substrate, or the like. Some components previously discussed with respect to FIG. 15, particularly in the LV region 14, are the same as or similar to components having the same reference numbers in FIG. 16, and thus, explicit discussion of these components is omitted with respect to FIG. 16.

In the HV region 12 of the substrate 10 are a first well HVPW1 and a second well HVPW2. The second well HVPW2 is at the boundary between the HV region 12 and the LV region 14 and has the isolation region 16 formed therein. Isolation region 84 is in the first well HVPW1 near an interface in the substrate 10 between the first well HVPW1 and an exterior well or component. Isolation region 86 is formed in the first well HVPW1, and a heavily doped p-type well P+ is formed in the first well HVPW1 between and adjacent the isolation regions 84 and 86. A heavily doped n-type well N+ with a lower doped extension region is formed in the first well HVPW1 adjacent the isolation region 86 opposite the heavily doped p-type well P+.

An isolation region 88 is formed at an interface in the substrate 10 between the first well HVPW1 and the second well HVPW2. A heavily doped p-type well P+ is formed in the second well HVPW2 between and adjacent isolation regions 88 and 16. An n-type drain diffusion region NDD is formed in the first well HVPW1 adjacent the isolation region 88 opposite the heavily doped p-type well P+ in the second well HVPW2. A heavily doped n-type well N+ is formed in the n-type drain diffusion region NDD and is adjacent the isolation region 88.

The HV gate dielectric 22 is over the HV region 12 of the substrate 10. A gate electrode 82 is formed over the HV gate dielectric 22 and extends laterally from over the extension region of the heavily doped n-type well N+ in the first well HVPW1 to over a portion of the n-type drain diffusion region NDD.

The dummy structure 42, as discussed with respect to FIG. 14, is over the HV gate dielectric 22 at the boundary between the HV region 12 and the LV region 14. Gate electrodes 82 and 56 in the HV region 12 and the LV region 14, respectively, can be formed in the same process steps as the dummy structure 42, as previously noted.

Spacers 90 are on sidewalls of the dummy structure 42. Spacers 92 are on sidewalls of the gate electrode 82. A contact etch stop layer 94 extends over the HV gate dielectric 22, the LV gate dielectric 28, the dummy structure 42, the gate electrodes 82 and 56, and the spacers 90, 92, and 77. Example materials for the spacers 90, 92, and 77 and the contact etch stop layer 94 include silicon oxide, silicon nitride, the like, or a combination thereof. A person having ordinary skill in the art will readily appreciate other acceptable materials for these components and processes to form them.

It should be noted that although the dummy structure 32 of FIG. 8 is used in the structure of FIG. 15, the dummy structure 42 of FIG. 14 can be used in the structure of FIG. 15. Similarly, although the dummy structure 42 of FIG. 14 is used in the structure of FIG. 16, the dummy structure 32 of FIG. 8 can be used in the structure of FIG. 16. A person having ordinary skill in the art will readily understand these modifications. Further, the dopant types in the wells in FIGS. 15 and 16 can be changed. For example, p-type wells can be changed to n-type wells, and n-type wells can be p-type wells.

Additionally, although the foregoing embodiments illustrate the dummy structures 32 and 42 as being formed over the isolation region 16 at the boundary between the HV region 12 and the LV region 14, the dummy structures 32 and 42 can be formed at any location proximate a boundary between a HV region and a LV region. This can be over an isolation region in the HV region 12 or the LV region 14 or over a diffusion region in the HV region 12 or the LV region 14.

Embodiments may achieve advantages. First, the dummy structures can eliminate boundary defects between a HV gate dielectric and a LV gate dielectric caused by polysilicon residue from forming polysilicon gate electrodes. The dummy structures can have no impact upon the performance of HV devices and LV devices. Next, the process can be easily integrated into existing processes. Further, an interlayer dielectric margin for the dummy structure is comparable with that of a gate electrode.

An embodiment is a structure comprising a high voltage (HV) gate dielectric over a HV region of a substrate, a low voltage (LV) gate dielectric over a LV region of the substrate, and a dummy structure over a top surface of the HV gate dielectric. A thickness of the LV gate dielectric is less than a thickness of the HV gate dielectric. The dummy structure is on a sidewall of the HV gate dielectric.

Another embodiment is a structure comprising a first device on a substrate, a second device on the substrate, and a dummy structure. The first device comprises a first gate dielectric, and the first gate dielectric has a first thickness. The second device comprises a second gate dielectric, and the second gate dielectric has a second thickness. The first thickness is greater than the second thickness. The dummy structure is over a top surface of the first gate dielectric, and the dummy structure is along a sidewall of the first gate dielectric.

A further embodiment is a method comprising forming a first gate dielectric layer on a first region of a substrate, the first gate dielectric layer having a first thickness; forming a second gate dielectric layer on a second region of the substrate, the second gate dielectric layer having a second thickness, the second thickness being less than the first thickness; depositing a gate electrode layer over the first gate dielectric layer and over the second gate dielectric layer; and patterning the gate electrode layer into a first gate on the first gate dielectric layer, a second gate on the second gate dielectric layer, and a dummy structure on a portion of the first gate dielectric layer.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a first gate dielectric layer on a first region of a substrate, the first gate dielectric layer having a first thickness;
   forming a second gate dielectric layer on a second region of the substrate, the second gate dielectric layer having a second thickness, the second thickness being less than the first thickness;
   depositing a gate electrode layer over the first gate dielectric layer and over the second gate dielectric layer;
   patterning the gate electrode layer into a first gate on the first gate dielectric layer, a second gate on the second gate dielectric layer, and a dummy structure on a portion of the first gate dielectric layer; and
   etching a recess into the substrate, the gate electrode layer being deposited in the recess, the dummy structure being in the recess.

2. The method of claim 1, wherein the dummy structure is on a sidewall of the first gate dielectric.

3. The method of claim 1, wherein the first gate and the first gate dielectric are components of a high voltage device, and the second gate and the second gate dielectric are components of a low voltage device.

4. The method of claim 1, wherein the gate electrode layer comprises polysilicon.

5. The method of claim 1, wherein the dummy structure is over an isolation region in the substrate.

6. A method comprising:
forming a first dielectric layer in a first region of a substrate, at least a portion of the first dielectric layer being a high voltage gate dielectric layer of a high voltage device;
forming a second dielectric layer in a second region of the substrate, at least a portion of the second dielectric layer being a low voltage gate dielectric layer of a low voltage device, the first region of the substrate being separated from the second region of the substrate by an isolation region;
forming a first gate electrode on the high voltage gate dielectric layer and a second gate electrode on the low voltage gate dielectric layer, the forming the first gate electrode and the second gate electrode further comprising forming a dummy structure along a sidewall of the first dielectric layer and on the isolation region; and
wherein during the forming the first dielectric layer, a protective layer is in the second region and has a sidewall on the isolation region, the first dielectric layer further being formed over the protective layer in the second region and on the isolation region, a step being formed by the first dielectric layer proximate the sidewall of the protective layer.

7. The method of claim 6, wherein a thickness of the first dielectric layer is greater than a thickness of the second dielectric layer.

8. The method of claim 6, wherein the forming the first dielectric layer further comprises removing the first dielectric layer over the protective layer and removing the step of the first dielectric layer proximate the sidewall of the protective layer.

9. The method of claim 8, wherein the removing the step of the first dielectric layer further comprises forming a recess in the isolation region between the sidewall of the first dielectric layer and the sidewall of the protective layer, the dummy structure being formed in the recess.

10. The method of claim 8, wherein after the removing step, the sidewall of the first dielectric layer adjoins the sidewall of the protective layer.

11. The method of claim 6, wherein the forming the first gate electrode, the second gate electrode, and the dummy structure comprises:

depositing a gate electrode layer over the first dielectric layer and over the second dielectric layer; and
patterning the gate electrode layer into the first gate electrode, the second gate electrode, and the dummy structure.

12. The method of claim 6, wherein the dummy structure comprises polysilicon.

13. A method comprising:
forming a protective layer on a first region of a substrate and an isolation region in the substrate;
forming a first dielectric layer on a second region of the substrate, the isolation region, and the protective layer on the first region, the isolation region being disposed between the first region and the second region;
removing the first dielectric layer on the protective layer on the first region, a sidewall of the first dielectric layer being formed on the isolation region;
forming a second dielectric layer on the first region of the substrate;
depositing a gate electrode layer on the first dielectric layer, the second dielectric layer, and the isolation region; and
patterning the gate electrode layer into a first gate electrode on the first dielectric layer, a second gate electrode on the second dielectric layer, and a dummy structure on the sidewall of the first dielectric layer and on the isolation region.

14. The method of claim 13, wherein the removing the first dielectric layer on the protective layer further forms a recess in the isolation region, the dummy structure being in the recess.

15. The method of claim 13, wherein after removing the first dielectric layer on the protective layer, the sidewall of the first dielectric layer adjoins a sidewall of the protective layer.

16. The method of claim 13, wherein a thickness of the first dielectric layer is greater than a thickness of the second dielectric layer.

17. The method of claim 13, wherein at least a portion of the first dielectric layer is a gate dielectric of a high-voltage device, and at least a portion of the second dielectric layer is a gate dielectric of a low-voltage device.

18. The method of claim 13, wherein the gate electrode layer comprises polysilicon.

* * * * *